Feb. 3, 1959 A. LIEBSCHER 2,872,625

TERMINAL CONNECTIONS FOR PRINTED WIRING ASSEMBLIES

Filed Aug. 7, 1956

INVENTOR
Arthur Liebscher
BY
Z. T. Wobensmith 2nd
ATTORNEY 2,872,625

TERMINAL CONNECTIONS FOR PRINTED WIRING ASSEMBLIES

Arthur Liebscher, Jenkintown, Pa.

Application August 7, 1956, Serial No. 602,646

8 Claims. (Cl. 317—101)

This invention relates to terminal connections for printed wiring assemblies and more particularly to improved electrically conductive joints between component leads and interconnecting wiring.

It has heretofore been proposed to dip solder printed or etched wiring boards to provide electrically conductive joints between the junctions of component leads and printed wiring terminals, but as heretofore practiced the results have not been entirely satisfactory.

Attempts to improve the joints have included bending the component leads where they emerge from the wiring board. Such leads were soldered at their points of contact or soldered along the lengths of the bent portions but frequently were not soldered at the point of emergence. The bending of leads is time consuming if effected manually or requires complicated equipment.

Straight (unbent) leads, sheared either before or after component assembly, are obviously the simplest, quickest and least expensive to assemble. Heretofore, only unreliable soldering prevented common usage of straight leads.

In accordance with the present invention an improved joint is provided between a component lead and the desired circuit of a wiring board.

In accordance with the present invention, also, a controlled quantity of solder is provided at the joint between a straight component lead and a printed circuit, and in a simple but effective manner.

In accordance with the present invention an improved joint is provided between a component lead and a printed circuit on a wiring board which is strong, has a permanent metal bond, and is quickly and easily applied.

In accordance with the present invention, also, by relatively simple changes in a printed wiring circuit it can be readily adapted to aid in providing an improved connection with a component lead.

Other objects and advantageous features of the invention will be apparent from the description and claims.

The nature and characteristic features of the invention will be more readily understood from the following description taken in connection with the accompanying drawings forming part thereof, in which.

It should, of course, be understood that the description and drawings herein are illustrative merely, and that various modifications and changes can be made in the structure disclosed without departing from the spirit of the invention.

Figure 1:
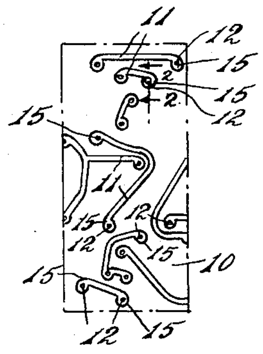
Figure 1 is a plan view of a portion of a wiring board with lead connections in accordance with the invention.
Figure 2:
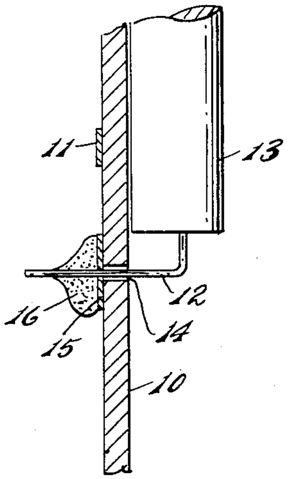
Fig. 2 is a fragmentary sectional view, enlarged, taken approximately on the line 2—2 of Fig. 1.

Referring now more particularly to Figs. 1 and 2 of the drawings, a wiring base or board 10, of insulating material, is shown, having an electrically conductive circuit etched or printed thereon to provide conductive strips 11.

The wiring board 10, at the locations where leads 12 of components 13 are intended to pass therethrough is provided with suitable openings 14, the components 13 usually being mounted or located on the opposite face of the board 10 from that on which the conductive strips 11 are located. The leads 12 pass perpendicularly through the board 10.

It has heretofore been suggested to provide enlargements on the conductive strips 11 at the locations where the leads 12 pass therethrough. Heretofore, the conductive strips were arranged to meet the enlargements radially. In accordance with the present invention, however, the conductive strips 11 are disposed so as to meet the enlargements, shown at 15, tangentially, and, also, so that the enlargements 15 are partly or wholly below the conductive strips 11, or in effect pendant to facilitate and control the solder applied thereto as hereinafter explained.

Figure 3:
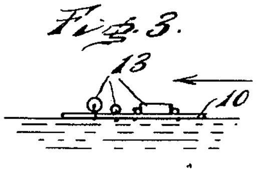
Fig. 3 is a diagrammatic view showing one step in the making of the lead connection and with the printed face of the wiring board in contact with molten solder.
Figure 4:
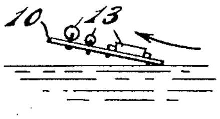
Fig. 4 is a diagrammatic view showing the manner of moving the wiring board after being brought into contact with the molten solder.
Figure 5:
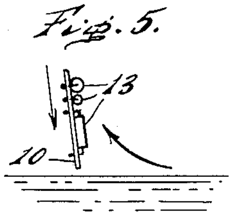
Fig. 5 is a view showing the further movement of the wiring board following the positioning shown in Fig. 4.

Referring now more particularly to Figs. 3, 4 and 5, of the drawings, the wiring board 10 is shown with the components 13 upwardly disposed, and with their leads 12 extending perpendicularly downwardly therethrough, through openings 14 and through the enlargements 15 of the conductive strips 11 of the printed circuit. The lower face of the wiring board 10 is immersed in a bath of molten solder S.

An appropriate edge of the wiring board 10 is now raised as indicated successively in Figs. 4 and 5. The edge thus raised is preferably the edge shown at the top of Fig. 1, to control the flow of solder along the conductive strips 11, and to the enlargements 15 thereof. The elapsed time in raising the wiring board 10 from the position shown in Fig. 3 to that shown in Fig. 5 is of the order of one tenth of a second.

As the wiring board is raised from the position shown in Fig. 3 to those successively indicated in Figs. 4 and 5 a portion of the solder adherent to the conductive strip 11 and the enlargements 15, depending on the location of the junction of the conductive strip 11 with respect to the enlargement 15, at the upper enlargements is retained in part in the pendant portion of the enlargements while permitted also to flow downwardly along the conductive strips 11 to lower enlargements 15 where it is also retained in part in the pendant enlargement. A bunching of the solder in the form of a sagging droplet 16 (see Fig. 2) is thus made available at each of the enlargements 15, bonded to the enlargement and to the contiguous portion of the leads 12 to provide a conductive joint and a firm anchor.

I claim:

1. A wiring board having a printed wiring circuit on one side face thereof with an exposed outer face, said wiring circuit being solder adherent over its entire outer face and having integral terminal circuit portions and circuit connections between and connecting said terminal portions, all of said terminal portions being offset from said circuit connections in the same direction and providing solder trapping and retaining portions.

2. A wiring board as defined in claim 1 in which a component lead has a portion extending perpendicularly through said board and in intersecting relation to one of said terminal portions, and has solder extending longitudinally of said lead portion and adherent thereto and to the terminal portion.

3. A wiring board having a printed wiring circuit on one side face thereof with an exposed outer face, said wiring circuit having terminal circuit portions and circuit connections between and connecting said terminal portions, said terminal portions and circuit connections being integral and solder adherent over the entire exposed extent thereof, all of said terminal portions being enlarged and offset from said circuit connections in the same direction on said side face and providing solder trapping and retaining portions.

4. A wiring board as defined in claim 3 in which a component lead has a portion extending perpendicularly through said board and in intersecting relation to one of said terminal portions, and has solder extending longitudinally of said lead portion and adherent thereto and to the terminal portion.

5. A wiring board as defined in claim 3 in which a component lead has a portion extending perpendicularly through said board and in intersecting relation to one of said terminal portions, and said lead portion has solder extending longitudinally thereof and in adherent engagement therewith and with said terminal portion, said solder being in the form of a droplet.

6. The method of soldering components to a printed circuit on one side of a board of insulating material in which the circuit is solder adherent throughout its extent and has terminal pads along said side extending in the same direction along said side from the remaining portions of the circuit which comprises inserting straight component leads perpendicularly through said terminal pads, immersing said side in a molten solder bath, and raising the sheet from the bath while draining solder from the remaining portions of the circuit and trapping and retaining solder at said pads in contact with the sides of said component leads and said pads.

7. The method of soldering components to a printed circuit on one side of a board of insulating material in which the circuit is solder adherent throughout its extent and has enlarged terminal pads along said side in pendant relation in the same direction to the remaining portions of the circuit which comprises inserting straight component leads perpendicularly through said terminal pads, immersing said side in a molten solder bath, and raising the sheet from the bath and turning the sheet to bring one edge upright and simultaneously draining solder from the remaining portions of the circuit and trapping and retaining solder at said pads in contact with said component leads and said pads.

8. The method of soldering components to a printed circuit on one side of a board of insulating material in which the circuit is solder adherent throughout its extent and has integral solder adherent enlarged terminal pads along said side offset in the same direction from the remaining portions of the circuit which comprises inserting straight component leads perpendicularly through said terminal pads, immersing said side in downturned relation in a molten solder bath, and raising the sheet from the bath with one edge moved to an upright position while draining solder from the remaining portions of the circuit and trapping and retaining solder at said pads in contact with said component leads and said pads.

References Cited in the file of this patent

UNITED STATES PATENTS

| | | |
|---|---|---|
| 2,244,009 | Hiensch | June 3, 1941 |
| 2,270,166 | Hiensch | Jan. 13, 1942 |
| 2,607,821 | Arsdell | Aug. 9, 1952 |
| 2,777,193 | Albright | Jan. 15, 1957 |